(12) United States Patent
Huang et al.

(10) Patent No.: US 10,263,001 B2
(45) Date of Patent: Apr. 16, 2019

(54) METHOD OF FORMING SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Ming Huang, Pingtung County (TW); Chien-Cheng Tsai, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/857,626

(22) Filed: Dec. 29, 2017

(65) Prior Publication Data

US 2018/0190665 A1 Jul. 5, 2018

(30) Foreign Application Priority Data

Dec. 29, 2016 (CN) .......................... 2016 1 1244788

(51) Int. Cl.
| H01L 27/108 | (2006.01) |
| H01L 23/532 | (2006.01) |
| H01L 23/522 | (2006.01) |
| H01L 21/311 | (2006.01) |
| H01L 29/417 | (2006.01) |
| H01L 29/49 | (2006.01) |
| H01L 21/285 | (2006.01) |
| H01L 21/3215 | (2006.01) |
| H01L 21/321 | (2006.01) |

(52) U.S. Cl.
CPC .... *H01L 27/10894* (2013.01); *H01L 23/5226* (2013.01); *H01L 23/53271* (2013.01); *H01L 27/10885* (2013.01); *H01L 27/10888* (2013.01); *H01L 27/10897* (2013.01); *H01L 21/28525* (2013.01); *H01L 21/31127* (2013.01); *H01L 21/32115* (2013.01); *H01L 21/32155* (2013.01); *H01L 27/10823* (2013.01); *H01L 29/4175* (2013.01); *H01L 29/4916* (2013.01)

(58) Field of Classification Search
CPC ................................................ H01L 27/10894
See application file for complete search history.

(56) References Cited

U.S. PATENT DOCUMENTS

2015/0064812 A1    3/2015 Patzer et al.
2016/0064285 A1*   3/2016 Moriwaki ........... H01L 21/3212
                                                      438/5

* cited by examiner

*Primary Examiner* — Errol V Fernandes
(74) *Attorney, Agent, or Firm* — Winston Hsu

(57) ABSTRACT

A method of forming semiconductor memory device including following steps. Firstly, a substrate having a memory cell region and a peripheral region is provided, and a first semiconductor layer is formed on the substrate within the periphery region. Next, an insulating layer and a second semiconductor layer are formed on the substrate, and the second semiconductor layer covers the substrate, the first semiconductor layer and the insulating layer. Then, a sacrificial layer is formed on the second semiconductor layer, wherein top surfaces of the sacrificial layer within the memory cell region and the periphery region are coplanar. Following these, a removing process is performed to remove the sacrificial layer, the second semiconductor layer and the insulating layer, to expose the first semiconductor layer. After that, a top surface of the first semiconductor layer is leveled with a top surface of the second semiconductor layer.

11 Claims, 11 Drawing Sheets

METHOD OF FORMING SEMICONDUCTOR MEMORY DEVICE

BACKGROUND OF THE INVENTION

1. Field of the Invention

The present invention generally relates to a method of forming a semiconductor memory device, and more particularly to a planarization process of a dynamic random access memory (DRAM) device.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell with a buried gate to gain enhanced performance and reliability of the corresponding memory device.

SUMMARY OF THE INVENTION

One object of the present invention is to provide a method of forming a semiconductor memory device, in which, a sacrificial layer with a predetermined thickness is formed to cover various regions of the semiconductor memory device, followed by performing a planarization process. That is, a preferable planarization of the semiconductor memory device may be achieved under a convenient process flow by using fewer masks.

To achieve the purpose described above, the present invention provides a method of forming semiconductor memory device including following steps. Firstly, a substrate is provided, and the substrate has a memory cell region and a peripheral region. Then, a first semiconductor layer is formed on the substrate, within the periphery region, and an insulating layer and a second semiconductor layer are sequentially formed on the substrate. Next, a sacrificial layer is formed on the second semiconductor layer, with a top surface thereof within the memory cell region and the peripheral region being coplanar. Following these, a removing process is performed to remove the sacrificial layer, a portion of the second semiconductor layer and a portion of the insulating layer to expose the first semiconductor layer. After the removing process, a top surface of the first semiconductor layer is then coplanar with a top surface of the second semiconductor layer.

The present invention provides a method of forming a semiconductor memory device, in which, the sacrificial layer having a predetermined thickness is formed to simultaneously cover on various regions of the semiconductor memory device, for improving the issues caused by non-coplanar top surfaces among those various regions. Thus, through the method of the present invention, the top surfaces of the sacrificial layer are coplanar within those various regions, so that the subsequent planarization process may be directly performed without firstly forming any mask layer, so as to simplify the planarization process of the semiconductor memory device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic diagrams illustrating a method of forming a semiconductor memory device according to a first preferred embodiment of the present invention, wherein:

FIG. 1 is a schematic cross-sectional view of a semiconductor memory device after forming a semiconductor layer;

FIG. 2 is a schematic cross-sectional view of a semiconductor memory device after forming a mask layer;

FIG. 3 is a schematic cross-sectional view of a semiconductor device after forming an opening;

FIG. 4 is a schematic cross-sectional view of a semiconductor device after forming another semiconductor layer;

FIG. 5 is a schematic cross-sectional view of a semiconductor device after performing a planarization process;

FIG. 6 is a schematic cross-sectional view of a semiconductor device after performing another planarization process.

FIG. 7 to FIG. 9 are schematic diagrams illustrating a method of forming a semiconductor memory device according to a second preferred embodiment of the present invention, wherein:

FIG. 7 is a schematic cross-sectional view of a semiconductor memory device after forming a sacrificial layer;

FIG. 8 is a schematic cross-sectional view of a semiconductor memory device after performing an etching back process;

FIG. 9 is a schematic cross-sectional view of a semiconductor memory device after performing another etching back process.

DETAILED DESCRIPTION

To provide a better understanding of the present invention, preferred embodiments will be described in detail. The preferred embodiments of the present invention are illustrated in the accompanying drawings with numbered elements.

Figure 1:
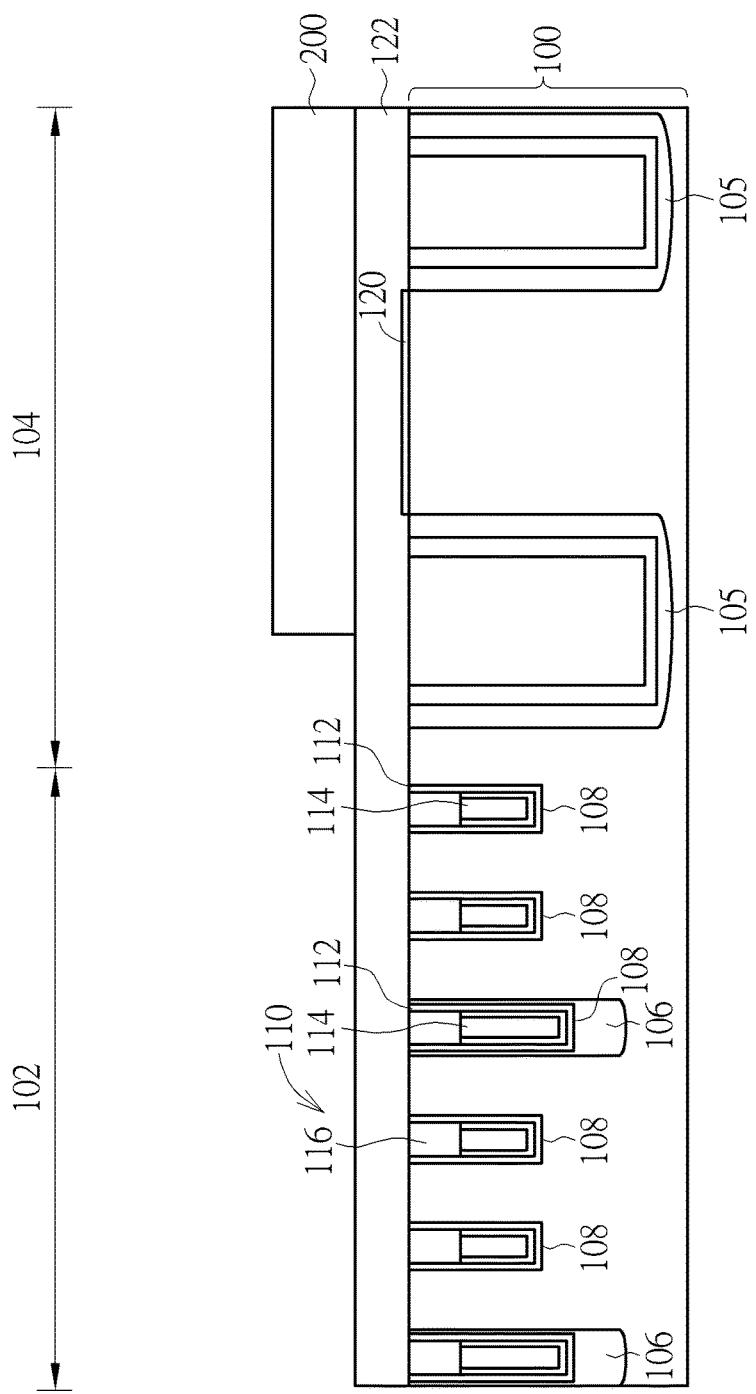

Referring to FIGS. 1-6, a method of forming a semiconductor memory device according to the first preferred embodiment of the present invention is shown. Firstly, a substrate 100 such as a silicon substrate, an epitaxial silicon substrate or a silicon on insulation (SOI) substrate is provided, and a memory cell region 102 and a periphery region 104 are defined on the substrate 100. Also, at least one shallow trench isolation (STI) is formed in the substrate 100, within the memory cell region 102 and the periphery region 104. In the present embodiment, STIs 106, 105 in different depths are respectively formed in the memory cell region 102 and the periphery region 104, as shown in FIG. 1. The STI 106 formed in the memory cell region 102 may further define at least one active region (not shown in the drawings) in the substrate 100.

On the other hand, at least one gate, preferably a plurality of buried gates 114 as shown in FIG. 1, is formed in the substrate 100, within the memory cell region 102. In the present embodiment, a plurality of trenches 108 parallelly extended with each other is firstly formed in the substrate 100, followed by sequentially forming a dielectric layer 112 covered entire surfaces of each trench 108, a buried gate 114 filled in a bottom portion of each trench 108, and an insulating layer 116 filled in a top portion of each trench 108, in each trench 108. It is noted that, the insulating layer 116 has a top surface leveled with a top surface of the substrate 100, so that, the buried gates 114 formed in the substrate 100 may therefore function like a plurality of word lines (WLs) 110.

Figure 2:
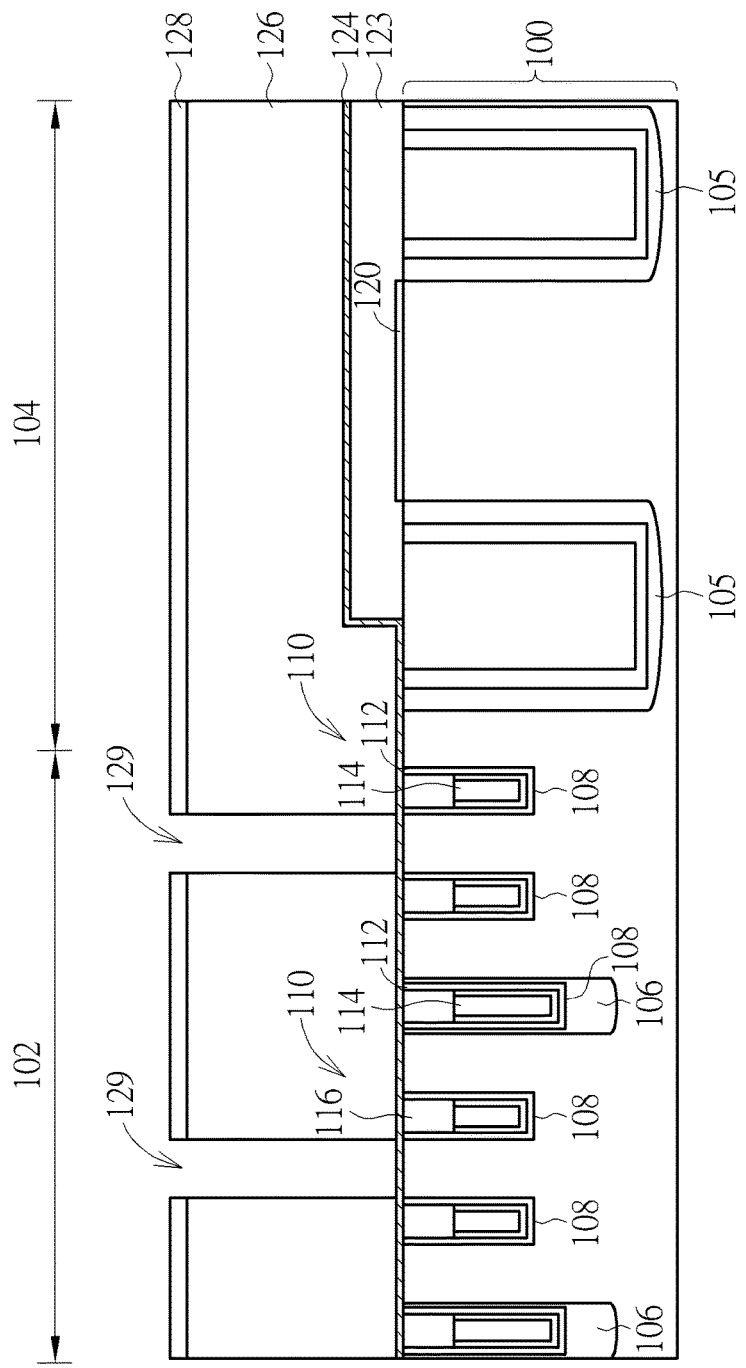

Next, a gate dielectric layer 120 is formed on the substrate 100, only within the periphery region 104, and then, a semiconductor layer 122 such as an amorphous silicon (A-Si) layer or a polysilicon (poly-Si) layer is formed on the gate dielectric layer 120, both within the memory cell region 102 and the periphery region 104. In one embodiment, the formation of the semiconductor layer 122 is for example accomplished through a chemical vapor deposition (CVD) process, and the semiconductor layer 122 includes a thickness about 300 angstroms and has a preferably dopant, such as a dopant with a first conductive type, but not limited thereto. Then, a mask layer 200 is formed to cover the periphery region 104, followed by performing an etching process, to remove the semiconductor layer 122 exposed from the mask layer 200. That is, a semiconductor layer 123 only disposed within the periphery region 102 is obtained on the gate dielectric layer 120, as shown in FIG. 2.

As following, an insulating layer 124 such as including an oxide-nitride-oxide (ONO) structure is formed on the entire substrate 100, and which directly contacts the semiconductor layer 123 within the periphery region 104, and the top surface of the substrate 100 and the word lines 110 underneath, within the memory cell region 102. Then, a mask layer such as a photoresist layer with a tri-layered structure is formed on the substrate 100, the mask layer for example includes a sacrificial layer 126 such as an organic dielectric layer (ODL), a silicon-containing hard mask (SHB) 128, and a patterned photoresist (not shown in the drawings) stacked one over another on the substrate 100. The patterned photoresist includes at least one opening pattern (not shown in the drawings) for defining contact slots, so that, a plurality of openings 129 may be formed in the SHB 128 and the sacrificial layer 128 as shown in FIG. 2, while transferring the opening patterns of the patterned photoresist to the stacked layers underneath, to expose a portion of the insulating layer 124 from the openings 129.

Figure 3:
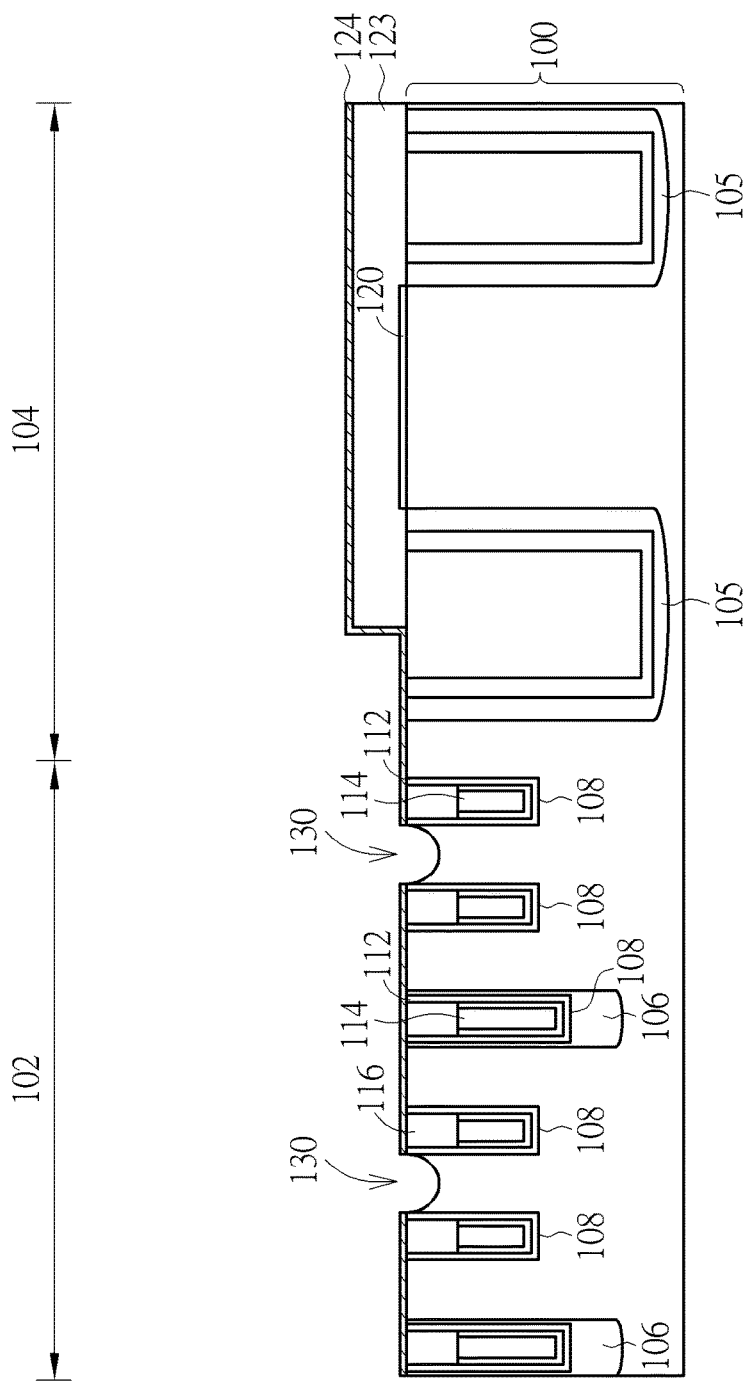

As shown in FIG. 3, an etching process is performed, to remove the exposed portion of the insulating layer 124 and a portion of the substrate 100 underneath through the openings 129, so as to form a plurality of contact slots 130 in the substrate 100, within the memory cell region 102. The contact slots 130 are preferably formed on the active area between two word lines 110, and a portion of the substrate 100 is therefore exposed from a bottom of the contact slots 130. Then, the SHB 128 and the sacrificial layer 126 are completely removed. In one embodiment, an ion implantation process, such as an anti-punch through ion implantation process, may be further performed on the exposed portion of the substrate 100, rather before or after removing the SHB 128 and the sacrificial layer 126. That is, a doped region (not shown in the drawings) is formed at the exposed portion of the substrate 100, for avoiding current leakage.

Figure 4:
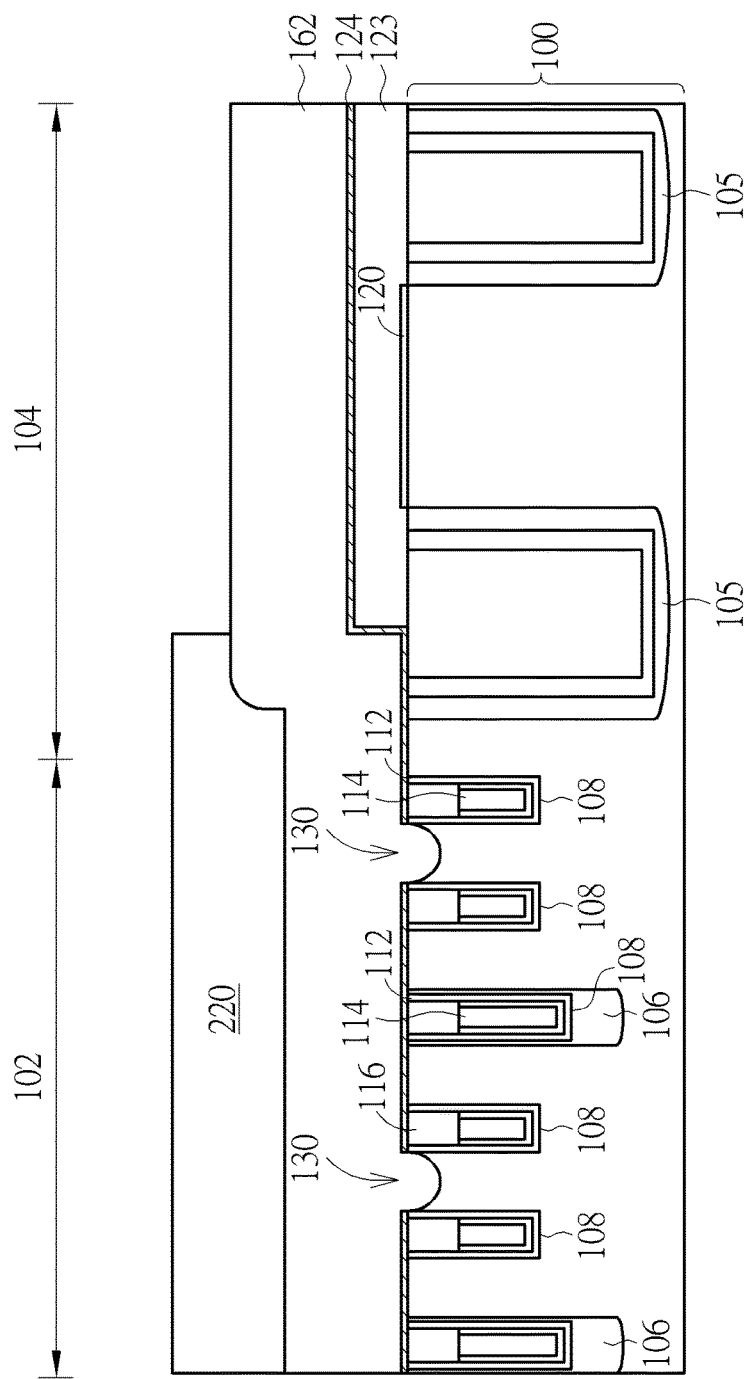

A semiconductor layer 162 is then formed on the substrate 100, both within the memory cell region 102 and the periphery region 104, through another CVD process, and the semiconductor layer 162 formed within the memory cell region 102 further fills in the contact slots 130, as shown in FIG. 4. In the present embodiment, the semiconductor layer 162 includes a material having the same etching selectivity with the semiconductor layer 123. For example, the semiconductor layer 162 and the semiconductor layer 123 may both include amorphous silicon or polysilicon. However, the semiconductor layer 162 preferably includes a dopant from that of the semiconductor layer 123, such as a dopant having a second conductive type, preferably for a high concentration of phosphorus (P), but is not limited thereto. The semiconductor layer 162 preferably has a thickness greater than that of the semiconductor layer 123, for example between about 800 angstroms and 900 angstroms, and also includes Following these, a planarization process of the semiconductor layer 162 is performed. In the present embodiment, the planarization process of the semiconductor layer 162 includes a two-stepped removing process. In the first-stepped removing process, a mask layer 220 is firstly formed, to cover the memory cell region 102 and a portion of the periphery region 104, followed by removing the semiconductor layer 162 through the mask layer 220. Precisely, the semiconductor layer 162 is originally formed both on the memory cell region 102 (only having the insulating layer 124 formed thereon) and the periphery region 104 (having the gate dielectric layer 120, the semiconductor layer 123 and the insulating layer 124), so that, a top surface of the semiconductor layer 162 within the periphery region 104 is relative higher than a top surface of the semiconductor layer 162 within the memory cell region 102, as shown in FIG. 4. The first-stepped removing process is namely performed by using the mask layer 220 to remove the higher portion of the semiconductor layer 162 within the periphery region 104. That is, the semiconductor layer 162 disposed within the periphery region 104 may obtain a top surface (not shown in the drawings) coplanar with the top surface of the semiconductor layer 162 within the memory cell region 102, and the mask layer 220 is then removed completely.

Figure 5:
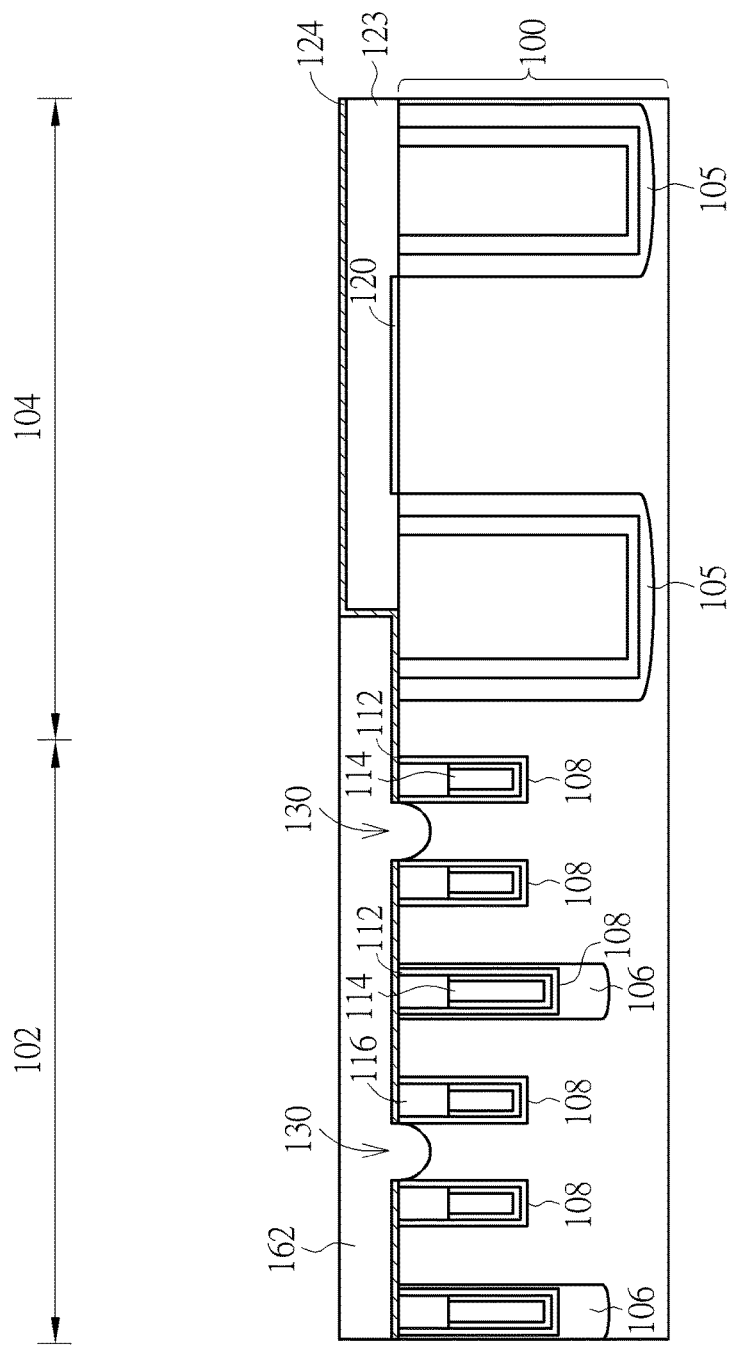

The second-stepped removing process such as a etching process or a chemical mechanical polishing (CMP) process is next performed, by using the insulating layer 124 on the semiconductor layer 123 as an etching stop layer, to simultaneous remove the semiconductor layer 162 both within the memory cell region 102 and the periphery region 104. That is, the semiconductor layer 162 may obtain a top surface which is leveled with the insulating layer 124, as shown in FIG. 5. In other words, in the second-stepped removing process, the semiconductor layer 162 is continuously removed till the semiconductor layer 162 within the periphery region 104 being completely removed to expose the insulating layer 124 underneath.

Figure 6:
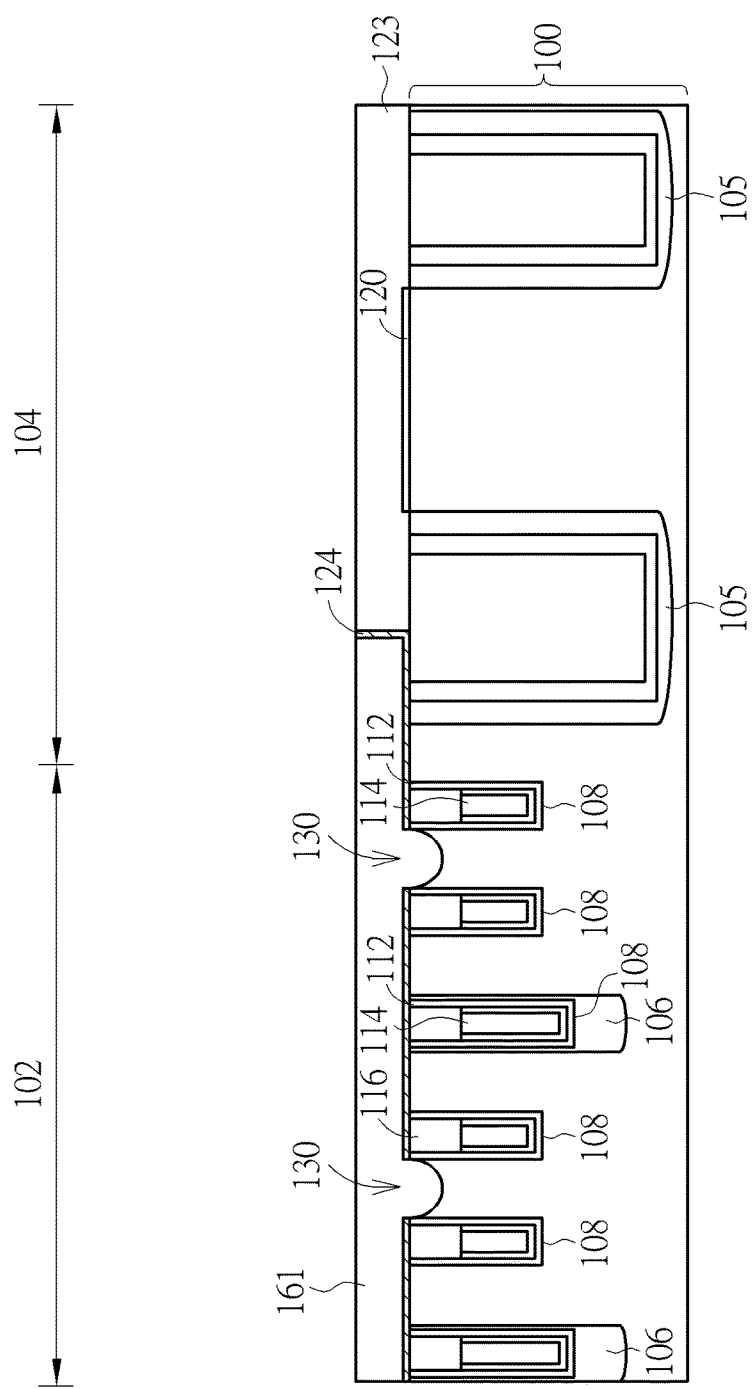

Then, another planarization process such as an etching process or a CMP process is performed, to partially remove the semiconductor layer 162 within the memory cell region 102, and to completely remove the insulating layer 124 disposed on the semiconductor layer 123 to expose the semiconductor layer 123 underneath. Though this performance, a semiconductor layer 161 disposed only within the memory cell region 102 and a portion of the periphery region 104 is obtained, and which includes a top surface which is leveled with the top surface of the semiconductor layer 123, as shown in FIG. 6.

According to above, a method of forming semiconductor memory device according to the first preferred embodiment is accomplished. In the present embodiment, for improving the non-coplanar top surfaces of the semiconductor layer 162 within the memory cell region 102 and the periphery region 104, the two-stepped removing process is performed. In the first-stepped removing process, the higher portion of the semiconductor layer 162, within the periphery region 104 is firstly removed by using the mask layer 220, and then, the second-stepped removing process is performed after removing the mask layer 220. After the two-stepped removing process, the semiconductor layer 123 and the semiconductor layer 161 disposed respectively in the memory cell region 102 and the periphery region 104 may therefore obtain coplanar top surfaces, so as to simplify the planarization process of the semiconductor memory device. Thus, the uniformity among different regions of the semiconductor memory device in the present invention is improved thereby.

People well skilled in the art shall realize the method of forming semiconductor memory device in the present invention is not limited to be achieved through the aforementioned flow, and may also include other forming steps. The following description will detail the different embodiments of the forming method of semiconductor memory device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
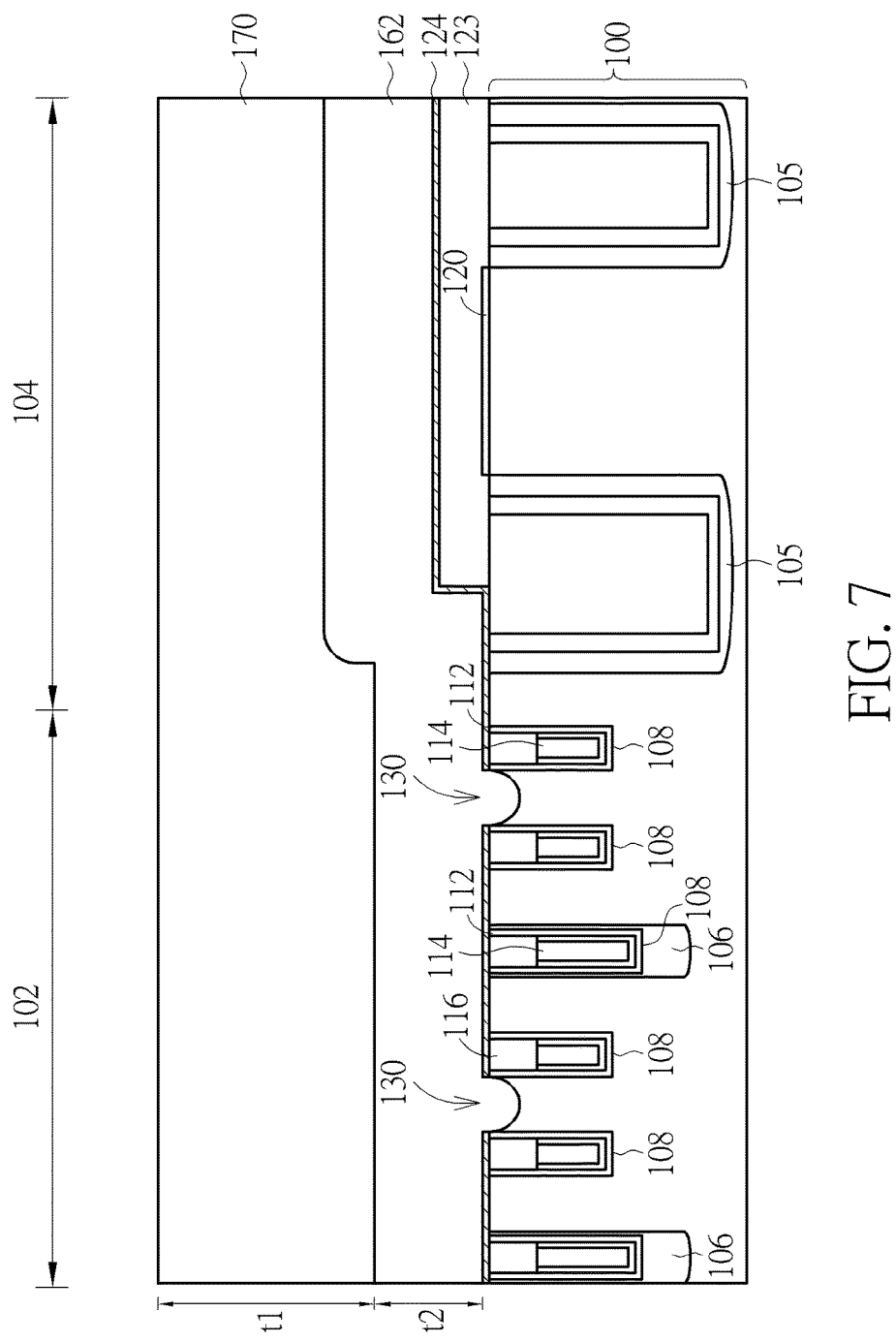
Figure 8:
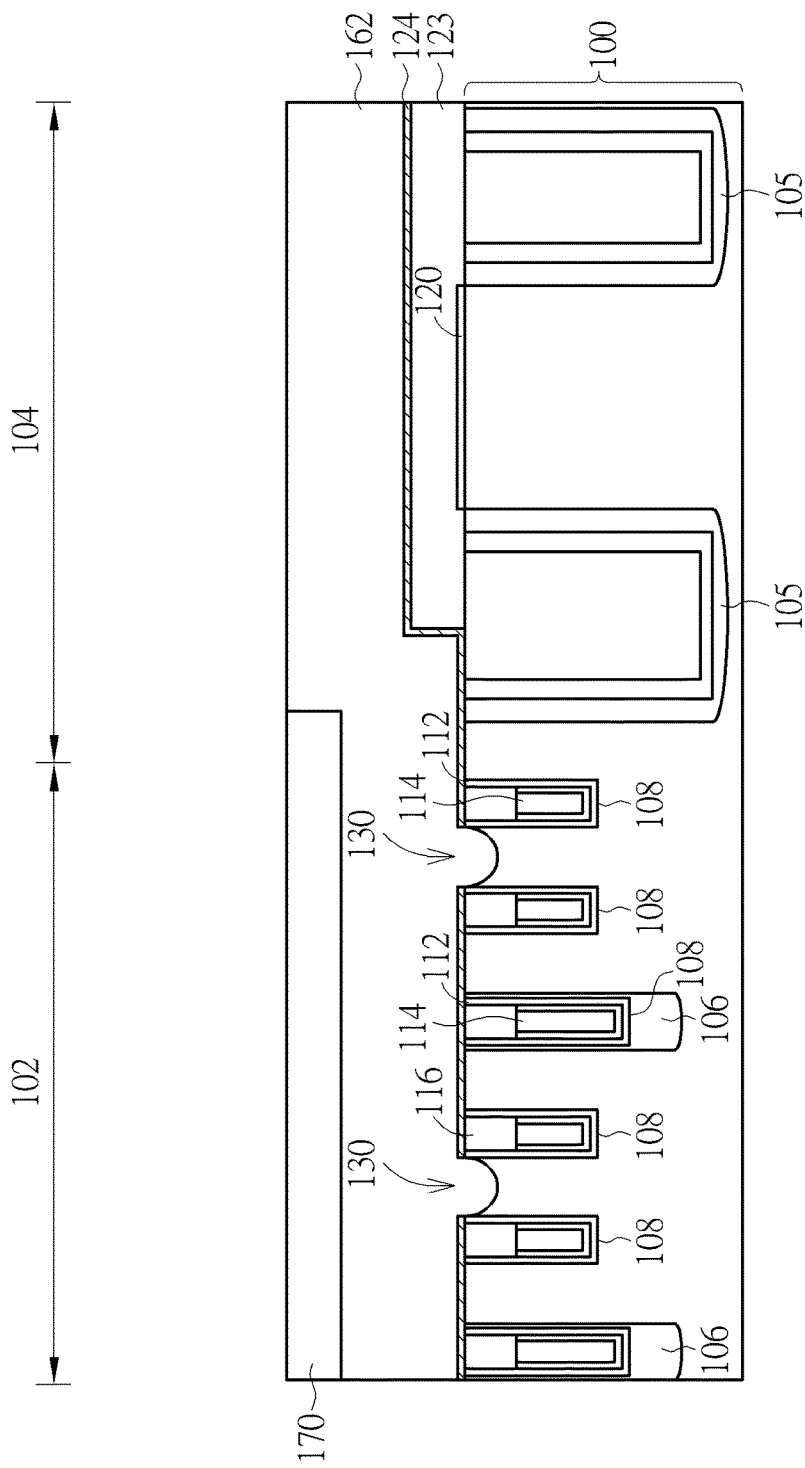
Figure 9:
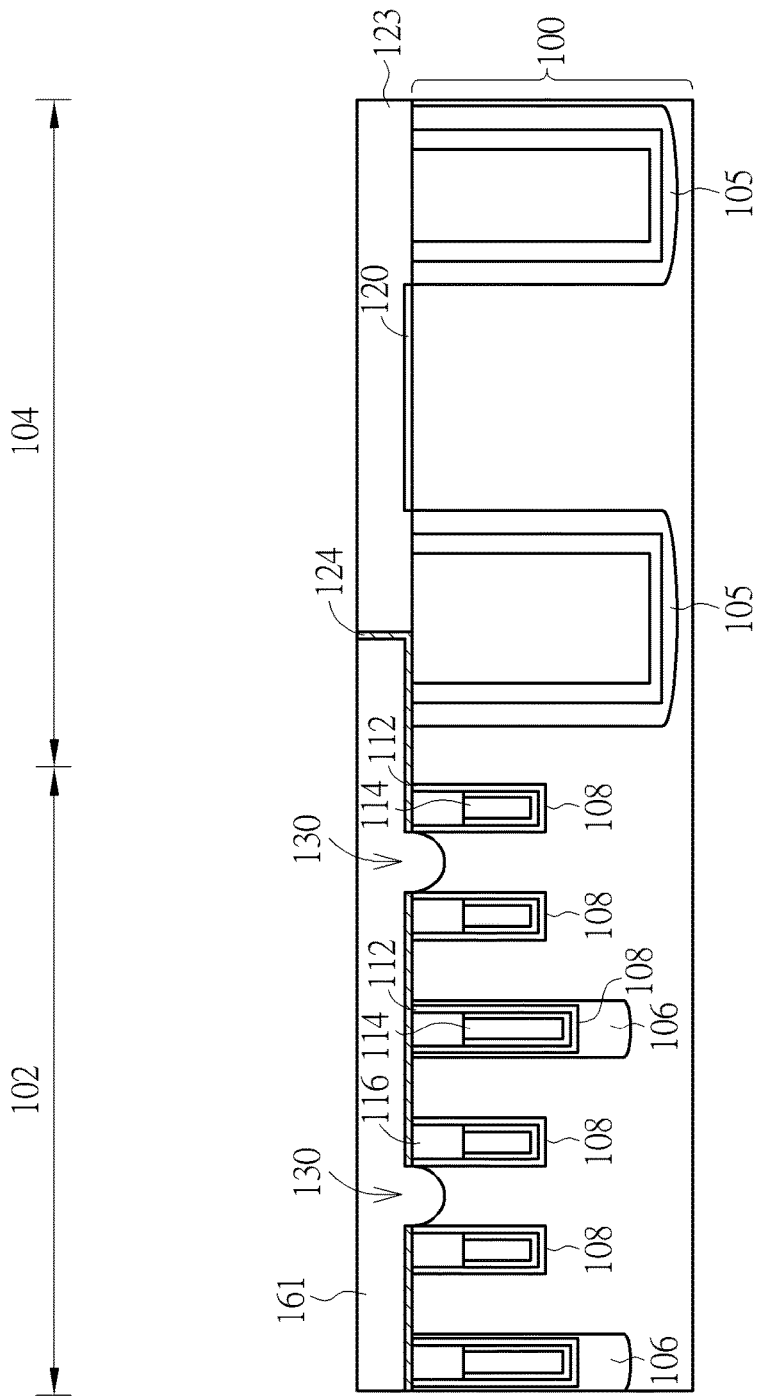

Refers to FIG. 7 to FIG. 9, which are schematic diagrams illustrating a method of forming semiconductor memory device according to the second preferred embodiment of the present invention. The formal steps in the present embodiment are substantially similar to those in the first preferred embodiment, as shown in FIGS. 1-3, and which will not be redundantly described hereinafter. The differences between the present embodiment and the aforementioned first preferred embodiment are that, after forming the semiconductor layer 162 in the present embodiment, a sacrificial layer such as an organic dielectric layer 170 is further formed on the semiconductor layer 162 as shown in FIG. 7.

The organic dielectric layer 170 includes a predetermined thickness t1, and the predetermined thickness t1 is preferably about two times or two times and half greater than that of the semiconductor layer 162, such as being about 2000 angstroms to 2300 angstroms. In this way, under the coverage of the organic dielectric layer 170, the stacked layers within the memory cell region 102 and the periphery region 104 may substantially have a coplanar top surface, as shown in FIG. 7. Then, a subsequent planarization process of the semiconductor layer 162 may be directly performed without firstly forming any mask layer.

In the present embodiment, the planarization process of the semiconductor layer 162 also includes a two-stepped removing process. In the first-stepped removing process, an etching back process is performed by using an etchant like fluoroform ($CHF_3$) or methane ($CH_4$), for specifically removing the organic dielectric layer 170 within the memory cell region 102 and the periphery region 104, till the organic dielectric layer 170 within the periphery region 104 being completely removed to expose the semiconductor layer 162 underneath. In other words, after completely removing the organic dielectric layer 170 within the periphery region 104 and partially removing the organic dielectric layer 170 within the memory cell region 102 in the first-stepped removing process, the organic dielectric layer 170 remains within the memory cell region 102 may therefore obtain a top surface leveled with the top surface of the semiconductor layer 162 disposed within the periphery region 104, as shown in FIG. 8.

Next, the second-stepped removing process such as another etching back process is performed, by using an etchant without any etching selectivity, such as fluoroform or methane, to simultaneously remove the organic dielectric layer 170 disposed in the memory cell region 102 and the semiconductor layer 162 disposed in the periphery region 104. In this way, the planarization of the organic dielectric layer 170 and the semiconductor layer 162 disposed in two different regions (the memory cell region 102 and the periphery region 104) are synchronously removed with the same etching rate, till the semiconductor layer 162 within the periphery region 104 being completely removed to expose the insulating layer 124 underneath. Subsequently, the processes as shown in FIGS. 5-6 of the first preferred embodiment may be performed, by performing an etching process or a CMP process, to partially remove the semiconductor layer 162 disposed within the memory cell region 102, and to completely remove the insulating layer 124 disposed on the semiconductor layer 123 to expose the semiconductor layer 123 underneath. Though this performance, a semiconductor layer 161 disposed only within the memory cell region 102 and a portion of the periphery region 104 is obtained, and which includes a top surface which is leveled with the top surface of the semiconductor layer 123, as shown in FIG. 9.

According to above, a method of forming semiconductor memory device according to the second preferred embodiment is accomplished. In the present embodiment, for improving the non-coplanar top surfaces of the semiconductor layer 162 within the memory cell region 102 and the periphery region 104, another two-stepped removing process, such as a two-stepped etching back process, is used without firstly forming any mask layer. After the two-stepped etching back process of the present embodiment, the semiconductor layer 123 and the semiconductor layer 161 disposed respectively in the memory cell region 102 and the periphery region 104 may therefore obtain coplanar top surfaces, so as to further simplify the planarization process of the semiconductor memory device. Furthermore, the organic dielectric layer 170 used in the present embodiment preferably includes the same or similar etching selectivity/polishing selectivity relative to the semiconductor layer 162, so that, the two-stepped etching back process are allowable to be performed by using the same etchant, for further simplify the process flow thereof.

Figure 10:
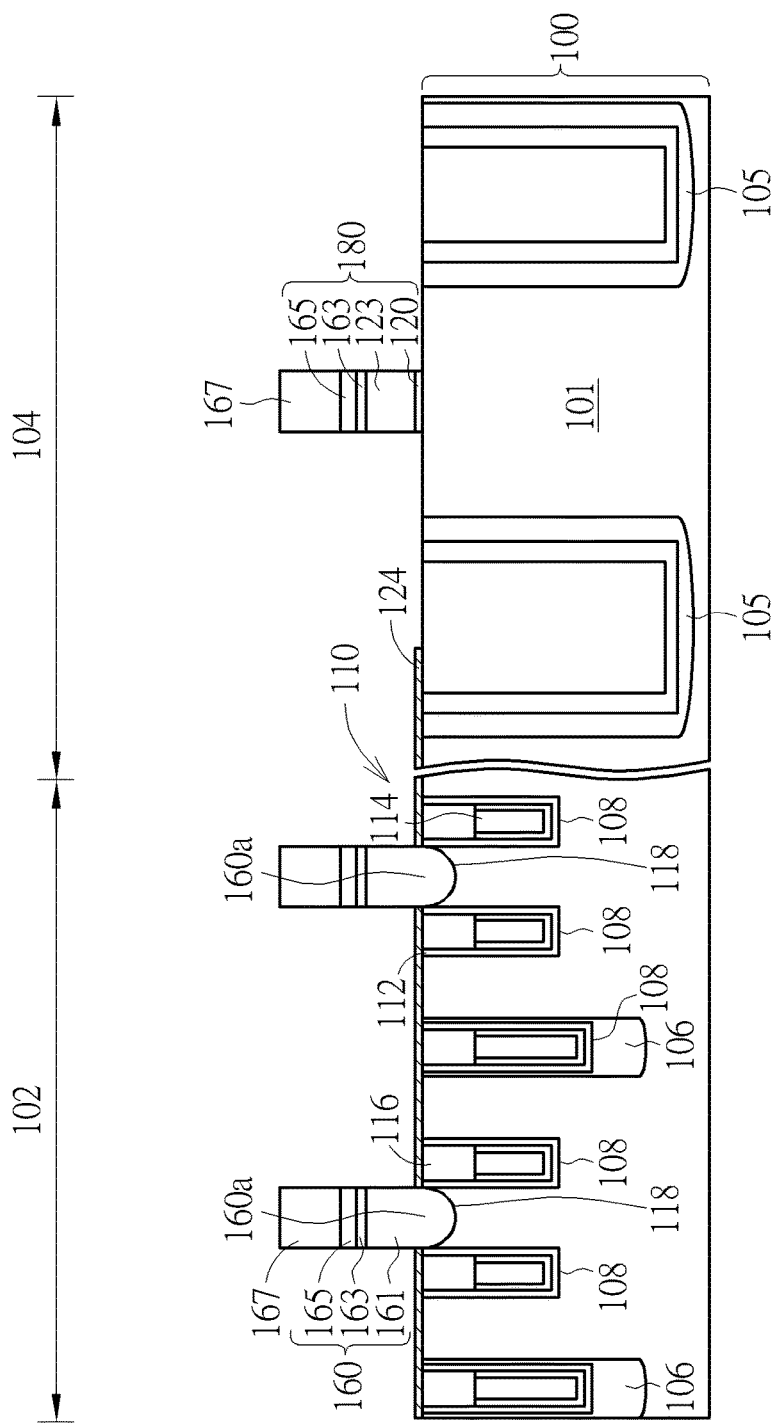
FIG. 10 is a schematic cross-sectional view of a semiconductor memory device according to a preferred embodiment of the present invention.

After performing the method of the aforementioned first or second embodiments, a barrier layer 163 for example a titanium (Ti) layer or a titanium nitride (TiN) layer, a metal conductive layer 163 for example including a low resistant metal like tungsten (W), aluminum (Al) or copper (Cu), and a mask layer 167 for example including silicon oxide, silicon nitride or silicon carbonitride (SiCN) stacked one over another may be further formed on the semiconductor layer 161 in the subsequent process. Following these, a patterning process may be performed on those stacked layers, to form a plurality of bit lines (BLs) 160 on the substrate 100, within the memory cell region 102. Meanwhile, at least one active element, such as a transistor 180, is formed as well within the periphery region 104, as shown in FIG. 10. Precisely, the semiconductor layer 161 filled in the contact slots 130 within the memory cell region 102 may therefore forms a plurality of bit line contacts (BLCs) 160a below the bit lines 160, and the bit line contacts 160a and the bit lines 160 are monolithic. The bit lines 160 and the word lines 110 are separated from each other by the insulating layer 124 and the insulating layer 116 disposed on the substrate 100, as shown in FIG. 10. On the other hand, the transistor 180 within the periphery region 104 includes a patterned gate dielectric layer 120, a gate layer (including a patterned semiconductor layer 123, a patterned barrier layer 163 and a patterned metal conductive layer 165), and a patterned mask layer 167, and the top surface of the gate layer may be coplanar with the top surfaces of the bit lines 160 within the memory cell region 102. It is noted that, the gate layer of the transistor 180 disposed within the periphery region 104, and the bit lines 160 and the bit line contacts 160a disposed within the memory cell region 102 are both formed from the semiconductor layers 123, 161, and the semiconductor layers 123, 161 preferably include the same material having dopants in different conductive types.

Figure 11:
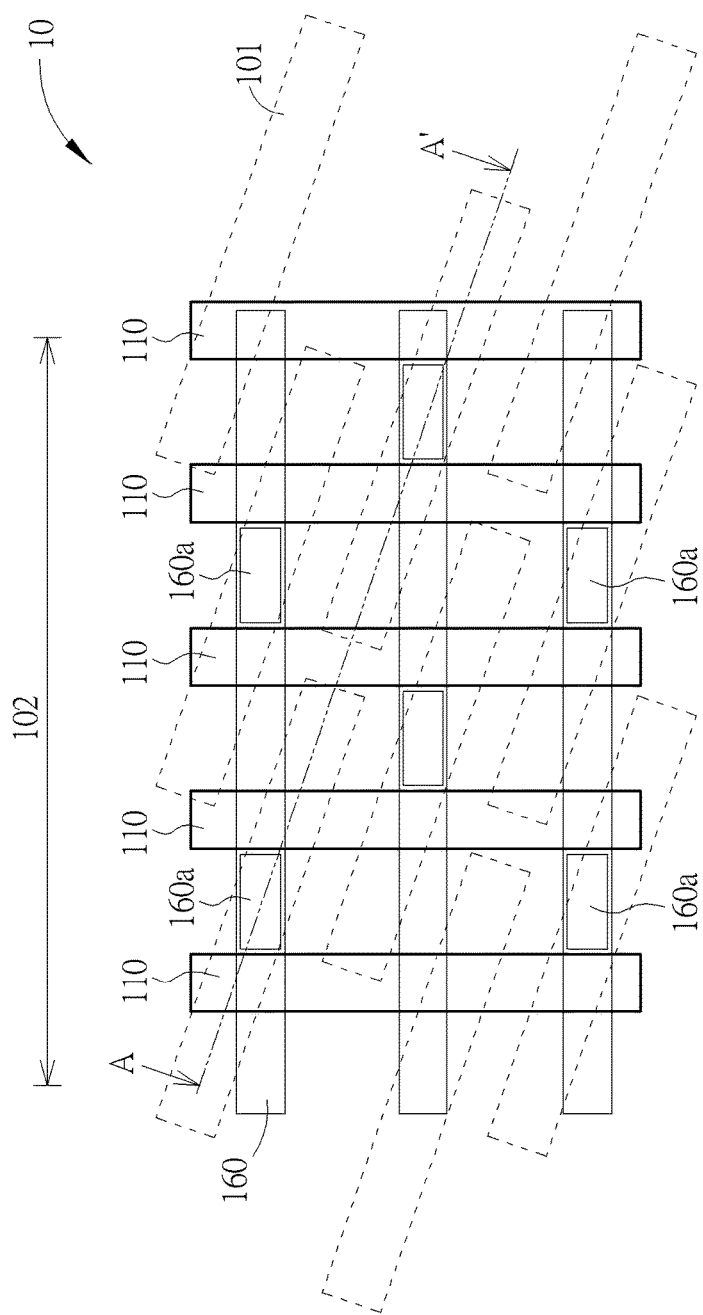
FIG. 11 is a schematic top view of a semiconductor memory device according to a preferred embodiment of the present invention.

According to the above, a DRAM device 10 as shown in FIG. 11 may be obtained, and which includes at least one transistor (not shown in the drawings) and at least one capacitor (not shown in the drawings), thereto serve as the smallest unit in the DRAM array for accepting signals from word lines 110 and bit lines 160 during the operation. The DRAM device 10 includes a plurality of active areas (AA) 101 on the substrate 100, the active areas 101 are parallelly extended along a first direction (not shown in the drawings). On the other hand, the word lines 110 (namely the buried gates 114 disposed in the substrate 100) are parallelly extended along a second direction (not shown in the drawings) to cross the active areas 101. Also, the bit lines 160 are parallelly disposed on the substrate 100, extended along a third direction (not shown in the drawings), to cross the active areas 101 and the word lines 110 at the same time. In other words, the extending direction of the bit lines 160 is different from that of the active areas 101 and the word lines 110, and the extending direction of the bit lines 160 are preferably perpendicular to that of the word lines 110 and not perpendicular to that of the active areas 101. Also, the bit lines 160 and the word lines 110 are electrically connected to a source/drain region (not shown in the drawings) of the transistor through the bit line contacts 160a disposed below the bit lines 160, between the two word lines 110, as shown in FIG. 11.

Overall speaking, the present invention provides a method of forming a semiconductor memory device, in which, the sacrificial layer having a predetermined thickness is formed to simultaneously cover on various regions of the semiconductor memory device, for improving the issues caused by non-coplanar top surfaces among those various regions. Thus, through the method of the present invention, the top surfaces of the sacrificial layer are coplanar within those various regions, so that the subsequent planarization process may be directly performed without firstly forming any mask layer, so as to simplify the planarization process of the semiconductor memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming semiconductor memory device, comprising:
    providing a substrate comprising a memory cell region and a peripheral region;
    forming a first semiconductor layer on the substrate, within the periphery region;
    sequentially forming an insulating layer and a second semiconductor layer on the substrate, wherein the insulating layer directly contacting a top surface of the substrate within the memory cell region, and a top surface of the first semiconductor layer within the periphery cell region;
    forming a sacrificial layer on the second semiconductor layer, a top surface of the sacrificial layer within the memory cell region being coplanar with a top surface of the sacrificial layer within the peripheral region; and
    performing a removing process to remove the sacrificial layer, a portion of the second semiconductor layer and a portion of the insulating layer to expose the first semiconductor layer, wherein, after the removing process, the second semiconductor obtains another top surface leveled with a top surface of the first semiconductor layer.

2. The method of forming semiconductor memory device according to claim 1, wherein the first semiconductor layer and the second semiconductor layer comprise a same material.

3. The method of forming semiconductor memory device according to claim 2, wherein the first semiconductor layer and the second semiconductor layer comprise different dopants.

4. The method of forming semiconductor memory device according to claim 1, wherein removing process comprises:
    performing a first etching process, specifically removing the sacrificial layer to expose the second semiconductor layer within the peripheral region; and
    performing a second etching process, simultaneously removing the sacrificial layer and the second semiconductor layer.

5. The method of forming semiconductor memory device according to claim 4, wherein the second etching process, the sacrificial layer and the second semiconductor layer are removed through a same etching rate.

6. The method of forming semiconductor memory device according to claim 1, wherein the sacrificial layer comprises an organic dielectric layer.

7. The method of forming semiconductor memory device according to claim 1, wherein the sacrificial layer has a thickness being two times or two times and half greater than a thickness of the second semiconductor layer.

8. The method of forming semiconductor memory device according to claim 1, further comprising:
    forming at least one contact slot within the memory cell region, and a portion of the substrate being exposed from a bottom of the contact slot.

9. The method of forming semiconductor memory device according to claim 8, wherein the second semiconductor layer directly contacts the portion of the substrate exposed from the contact slot.

10. The method of forming semiconductor memory device according to claim 8, further comprising:
    forming a doped region in the substrate under the bottom of the contact slot.

11. The method of forming semiconductor memory device according to claim 1, after the removing process further comprising:
    patterning the second semiconductor layer to form at least one bit line within the memory cell region.

* * * * *